United States Patent [19]
Larkin et al.

[11] Patent Number: 5,455,537
[45] Date of Patent: Oct. 3, 1995

[54] FEED FORWARD AMPLIFIER

[75] Inventors: Robert S. Larkin, Corvallis; David L. Wills, Albany, both of Oreg.

[73] Assignee: Radio Frequency Systems, Inc., Marlboro, N.J.

[21] Appl. No.: 292,869

[22] Filed: Aug. 19, 1994

[51] Int. Cl.$^6$ .................................................. H03F 1/32
[52] U.S. Cl. .................................... 330/52; 330/151
[58] Field of Search ............................ 330/52, 149, 151

[56] References Cited

U.S. PATENT DOCUMENTS

| | | | |
|---|---|---|---|
| 3,922,617 | 11/1975 | Denniston et al. | 330/149 |
| 4,263,564 | 4/1981 | Lafon | 330/293 |
| 4,412,185 | 10/1983 | Gerard | 330/149 |
| 4,517,521 | 5/1985 | Preschutti et al. | 330/2 |
| 4,560,945 | 12/1985 | Olver | 330/149 |
| 4,580,105 | 4/1986 | Myer | 330/149 |
| 4,617,522 | 10/1986 | Tarbutton et al. | 330/149 |
| 4,625,178 | 11/1986 | Mannerstrom | 330/149 |
| 4,629,996 | 12/1986 | Watanabe et al. | 330/151 |
| 4,812,779 | 3/1989 | Wagner | 330/149 |
| 4,926,134 | 5/1990 | Olver | 330/2 |
| 4,943,783 | 7/1990 | Nojima | 330/149 |
| 5,023,565 | 6/1991 | Lieu | 330/151 |
| 5,051,704 | 9/1991 | Chapman et al. | 330/52 |
| 5,065,110 | 11/1991 | Ludvik et al. | 330/149 |
| 5,077,532 | 12/1991 | Obermann et al. | 330/151 |
| 5,117,197 | 5/1992 | Hsu et al. | 330/149 |
| 5,130,663 | 7/1992 | Tattersall, Jr. | 330/52 |
| 5,148,117 | 9/1992 | Talwar | 330/151 |
| 5,155,448 | 10/1992 | Powell | 330/149 |
| 5,157,346 | 10/1992 | Powell et al. | 330/151 |
| 5,166,634 | 11/1992 | Narahashi et al. | 330/151 |
| 5,323,119 | 6/1994 | Powell et al. | 330/151 |

FOREIGN PATENT DOCUMENTS

198809  8/1989  Japan .................................. 330/151

*Primary Examiner*—James B. Mullins
*Attorney, Agent, or Firm*—Ware, Fressola, Van Der Sluys & Adolphson

[57] ABSTRACT

In a feed forward amplifier (100), a main amplifier (125) is coupled between an input (102) at which an input signal is received and an output (173) at which an output signal is provided. The output signal is an amplification of the input signal. A sample of the output signal is compared (144) with a sample of the input signal to produce a difference signal indicative of distortions introduced by the main amplifier (125). An error amplifier (165) provides a distortion signal which is an amplification of the difference signal, and the distortion signal is combined (169) with the output signal to compensate for main amplifier distortions. A random frequency, constant amplitude sine wave pilot signal is combined (117) with the input signal, and a correlation power detector (194,195,202,212,213) is provided to determine the magnitude of the pilot signal in the output signal. The gain and phase of the difference signal is then adjusted (155) to minimize the magnitude of the pilot signal in the output signal. Additionally, a distortion signal power signal, which is indicative of the magnitude of the difference signal, is provided (151,158), and the gain and phase of the input signal is adjusted (112) to minimize the magnitude of the distortion signal power signal.

14 Claims, 5 Drawing Sheets

FEED FORWARD AMPLIFIER

TECHNICAL FIELD

The present invention relates to amplifiers and more particularly to amplifiers having feed forward for distortion reduction.

BACKGROUND OF THE INVENTION

Radio frequency (RF) amplifiers are used in a wide variety of communications and other electronic applications. It is well known to use feed forward for distortion reduction in an RF amplifier. In a basic feed forward system, the instantaneous difference between an amplifier input and its output, representing the amplifier distortion, is amplified and subtracted from the output. In effect, by knowing what the amplifier distortion is, it is possible to remove it by simple subtraction.

Figure 1:
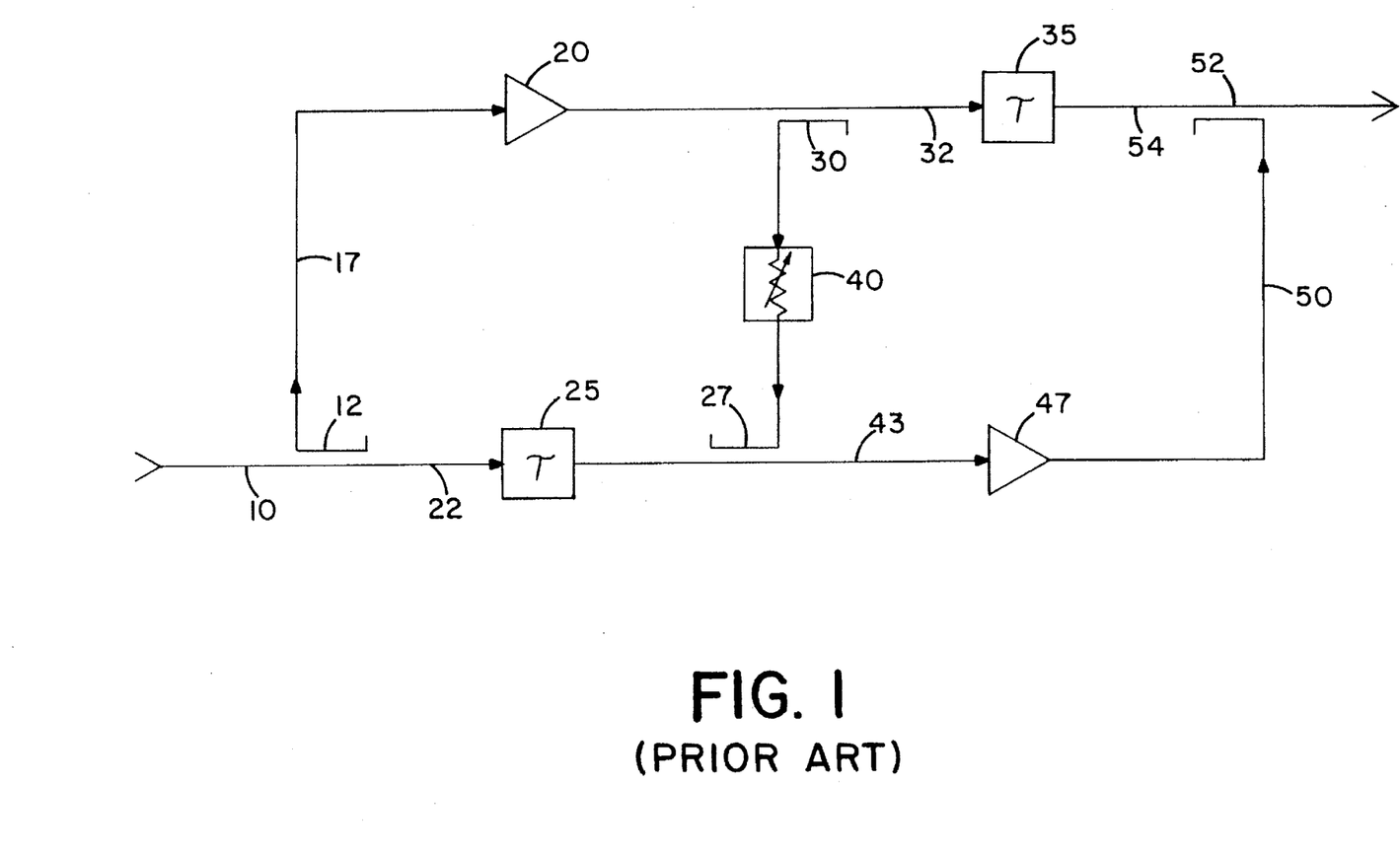
FIG. 1 is a schematic block diagram showing a conventional, prior art feed-forward amplifier.

FIG. 1 shows the basic construction of a conventional feed forward amplifier. An input signal is provided on a line 10 to a directional coupler 12 which divides the input signal into two parts including a primary portion which is provided on a line 17 to a main amplifier 20 and a sampled portion which is provided on a line 22 to a delay line 25. The main amplifier 20 increases the level of the primary portion of the input signal, and in doing so introduces distortions. The delay line 25 is provided to compensate for the time delay of the primary portion of the input signal through the main amplifier, and the output of the delay line 25 is provided to a difference coupler 27.

The output of the main amplifier 20 is an amplified input signal which is provided to a directional coupler 30 where it is divided into two parts including a primary portion provided on a line 32 to a delay line 35 and a sampled portion which is provided via an attenuator 40 to the difference coupler 27. The attenuator 40 reduces the magnitude of the sample of the amplified input signal so that its magnitude is approximately the same as the magnitude of the delayed sampled portion of the input signal. The output of the difference coupler 27 is the difference between the output of the attenuator 40 and the delayed sampled portion of the input signal, which is a distortion signal that is primarily the distortion from the main amplifier. The distortion signal is provided on a line 43 to an error amplifier 47 the output of which is provided on a line 50 to a second difference coupler 52. The delay line 35 is provided to compensate for the time delay of the distortion signal through the error amplifier 47, and the output of the delay line 35 is also provided to the second difference coupler 52 via a line 54. The error amplifier increases the level of the distortion signal on the line 43 so that it can be subtracted from the amplified input signal in the difference coupler 52. Therefore, the feed forward amplifier of FIG. 1 provides a simple method for amplifying and subtracting out the distortion introduced by the main amplifier.

A problem with a feed forward amplifier of the type described above and illustrated in FIG. 1 is that its performance is dependent on circuit component characteristics and tolerances. The subtraction of the distortion signal must be done precisely, e.g., proper gain and phase, to be effective. Additionally, the feed forward amplifier represents an open loop process, meaning that there is no feed-back involved to make automatic adjustments for circuit errors. Therefore, as the gain and phase characteristics of the feed forward amplifier change with age and with changes in environmental conditions such as temperature and humidity, the circuit of FIG. 1 may not properly subtract the distortion from the output signal.

SUMMARY OF THE INVENTION

Objects of the invention include the provision of a feed forward amplifier which provides automatic adjustment of amplifier gain and phase to thereby compensate for changes in amplifier characteristics caused by use and by changes in environmental conditions.

Another object of the present invention is to provide a feed forward amplifier which provides improved precision in the subtraction of distortion from an output signal over various operating conditions of the feed forward amplifier.

A still further object of the present invention is to provide a feed forward amplifier having automatic adjustments of main amplifier gain and phase for minimizing the power going to an error amplifier.

According to the present invention, a pilot signal is introduced into a main amplifier of a feed forward system, the amplifier output is measured to determine the magnitude of the pilot signal contained in the amplifier output, and a feedback path is provided to minimize the magnitude of the pilot signal contained in the amplifier output.

In further accord with the present invention, an electronically adjustable attenuator and phase shifter is placed in series with the main amplifier and with an error amplifier, both of the electronically adjustable attenuator and phase shifters are responsive to control signals provided from the feedback path for minimizing the magnitude of the pilot signal within the amplifier output.

In still further accord with the present invention, the pilot signal is a random noise signal.

According further to the present invention, the pilot signal is a sine wave of varying, random frequency, the frequency being controlled by a random noise generator, and the pilot signal having a constant peak amplitude.

According still further to the present invention, the pilot signal is applied to a pair of mixers which operate as a correlation power detector to sense the magnitude of the pilot signal present in the amplifier output.

In further accord with the present invention, the pilot signal is alternatively applied and then removed from the system to provide for the detection and removal of bias voltages in the correlation detector.

In still further accord with the present invention, the pilot signal occupies the same spectrum as the amplified signal by using a spread spectrum technique.

The system of the present invention provides a significant improvement over the prior art by providing a feed forward amplifier having an error sensing system which is adaptively controlled for the removal of distortions from an output of the amplifier. The system of the invention uses a pilot signal which allows the adjustment of the gain and phase of signals provided through a main amplifier and an error amplifier of the feed forward amplifier, the control of the gain and phase adjustments being automatically performed in a feed-back loop using the pilot signal. The pilot signal is a random frequency signal which occupies the same spectrum as the amplified output signal, and a correlation power detector is provided to detect the magnitude of the pilot signal present in the amplified output while providing, on average, no output for any other signals that may be present in the amplified output. The present invention provides for the alternative application and removal of the pilot signal to the system to thereby allow bias voltages which build up in the correlation detector to be identified and removed. This allows operation of the system at much lower noise levels than would be otherwise possible.

The foregoing and other objects, features and advantages of the present invention will become more apparent in light of the following detailed description of exemplary embodiments thereof in view of the accompanying drawings.

BEST MODE FOR CARRYING OUT THE INVENTION

The feed forward amplifier of the present invention is provided with an error sensing and correcting system which is particularly well suited for minimizing distortions in an output of the feed forward amplifier introduced by a main amplifier of the feed forward amplifier and also for minimizing the power requirements of an error amplifier of the feed forward amplifier.

Figure 2:
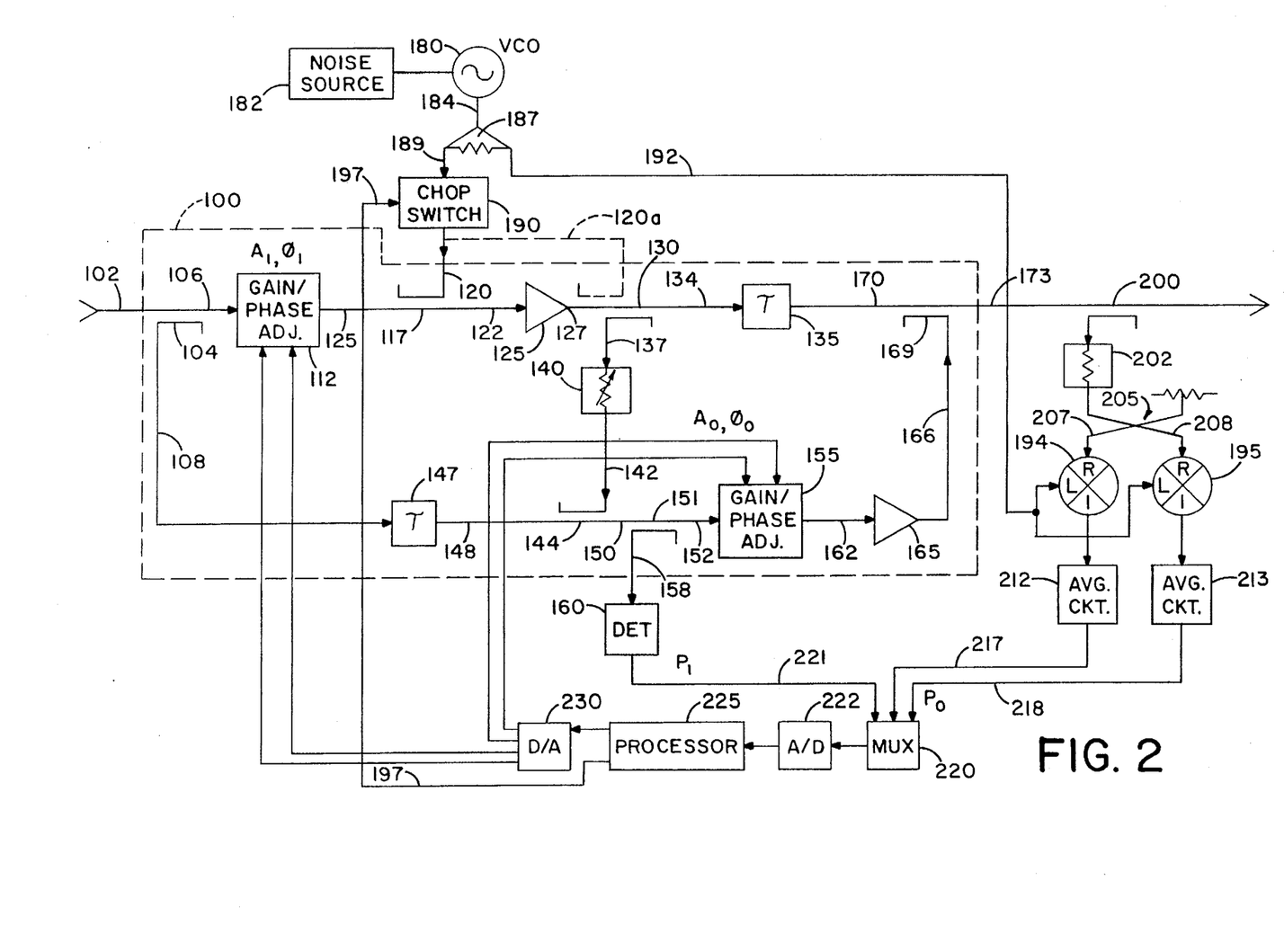
FIG. 2 is a schematic block diagram of a feed forward amplifier having an error detection system of the present invention.

Referring to FIG. 2, an input signal is provided to the feed forward amplifier 100 on a line 102. The input signal is provided to a directional coupler 104 which divides the input signal into two parts including a primary portion on a line 106 and a sampled portion on a line 108. The primary portion of the input signal is provided on the line 106 to an electronically adjustable attenuator and phase shifter (GPA) 112 the operation of which will be described in greater detail hereinafter. The output of the GPA 112 is provided on a line 115 to a coupler 117 where a pilot signal on a line 120 is added to the primary portion of the input signal. As described in greater hereinafter, the pilot signal on the line 120 is used in an error detection and correction portion of the invention for minimizing distortions in the output of the feed forward amplifier.

The output of the coupler 117 is provided on a line 122 to a main amplifier 125. The main amplifier amplifies the combined pilot signal and primary portion of the input signal, and in doing so introduces distortions into the signal path. The main amplifier output is provided on a line 127 to a coupler 130 where the main amplifier output is divided into two parts. A primary portion of the main amplifier output is provided on a line 134 to a delay function (delay line) 135 and a sampled portion of the main amplifier output is provided on a line 137 to an attenuator 140. The attenuator 140 reduces the magnitude of the sampled portion of the main amplifier output, and the output of the attenuator 140 is provided on a line 142 to a coupler 144 where the output of a delay function (delay line) 147, which is provided on a line 148 to the coupler 144, is subtracted from the output of the attenuator 140. The input to the delay function 147 is the sampled portion of the input signal on the line 108. The delay time of the delay function 147 is selected to correspond to the delay time experienced by the primary portion of the input signal while being amplified by the main amplifier 125.

Therefore, the output of the coupler 144 is a distortion signal which is primarily indicative of the distortion from the main amplifier 125. The output of the coupler 144 is provided on a line 150 to a coupler 151 which divides the distortion signal into two parts including a primary portion which is provided on a line 152 to an electronically adjustable attenuator and phase shifter (GPA) 155, the operation of which will be described in greater detail hereinafter. The other output of the coupler 151 is a sampled portion of the distortion signal which is provided on a line 158 to a detector 160. The detector 160 is part of the error detection and correction circuit of the invention, and its operation will also be described in greater detail hereinafter.

The output of the GPA 155 is provided on a line 162 to an error amplifier 165 wherein the primary portion of the distortion signal is amplified. The output of the error amplifier is provided on a line 166 to a coupler 169. The other input to the coupler 169 is the primary portion of the main amplifier output, after passing through the delay function 135, on a line 170. The delay time of the delay function 135 corresponds to the delay experienced by the distortion signal when passing through the error amplifier 165.

In the coupler 169, the amplified distortion signal on the line 166 is subtracted from the delayed main amplifier output signal on the line 170, and therefore the output of the directional coupler on the line 173 is the amplified input signal with the distortion of the main amplifier removed.

The error detection and correction system of the present invention controls the gain and phase of the input signal provided to the main amplifier 125 and the distortion signal provided to the error amplifier 165 for providing highly accurate removal of the distortion from the main amplifier output. The error detection and correction system includes both GPAs 112, 155 and everything outside of the dashed line which defines the feed forward amplifier 100.

The pilot signal on the line 120 is provided by a voltage controlled oscillator (VCO) 180 which generates a constant amplitude sinusoidal wave having a random frequency. The random frequency of the pilot signal is determined by a noise source 182 which will be described in greater detail hereinafter with respect to FIG. 4. The output of the VCO 180 is provided on a line 184 to a power divider 187 where the pilot signal is divided into two parts, one part being provided on a line 189 to a chop switch 190 and the other part being provided on a line 192 to a pair of mixers 194, 195. The chop switch 190 is responsive to a control signal provided on a line 197 for alternately applying and removing the pilot signal from the input to the main amplifier 125 via line 120, the coupler 117 and line 122.

The pilot signal is injected into the main amplifier 125 to represent distortions in the main amplifier. The pilot signal differs from the actual distortions produced by the main amplifier in that the pilot signal is known precisely and can therefore be separated at the feed forward amplifier output from other signals, noise and distortions.

A sample of the feed forward amplifier output on the line 173 is taken by a directional coupler 200 and provided via an attenuator 202 to a coupler 205 where the sampled output signal is divided into two signals with equal amplitude and 90 degrees phase difference. The output of the coupler 205 is provided on lines 207 and 208, respectively, to mixers 194 and 195 wherein the two signals are multiplied by the pilot signal on the line 192. The output of each of the mixers 194, 195 is provided to an averaging circuit (low pass filter) 212, 213. The two mixers 194, 195 work in conjunction with the averaging circuits 212, 213, the coupler 205 and the pilot signal on the line 192 for providing a correlation detector for determining the power in the feed forward amplifier output signal on line 173 corresponding to the pilot signal. Each averaging circuit 212, 213 averages the output of the corresponding mixer 194, 195, each producing at its output a low frequency signal ($V_I$, $V_Q$) which are respectively provided via signal lines 217, 218 to a multiplexer 220. The power ($P_0$) that is in the feed forward amplifier output and which is correlated with the pilot signal may be determined based on the low frequency signals $V_I$ and $V_Q$ as given by the following equation:

$$P_0 = (V_I)^2 + (V_Q)^2$$

As will be described in greater detail hereinafter, by adjusting the gain and phase of the GPA 155 to minimize this power, the distortions provided in the feed forward amplifier output signal on the line 173 are minimized.

The other input to the multiplexer 220 is a distortion signal power ($P_1$) which is provided as the output of the detector 160 on a line 221. The detector 160 is responsive to the sampled distortion signal for providing an indication of distortion signal power ($P_1$). If the subtraction in the coupler 144 of the sampled (and delayed) input signal from the sampled (and attenuated) output of the main amplifier is ideal, then the distortion signal on the line 150 is indicative of the distortion introduced by the main amplifier 125. However, if the subtraction is not ideal, the distortion signal may include a small portion of the input signal which increases the magnitude of the distortion signal amplified by the error amplifier 165 and subtracted from the main amplifier output in the coupler 169. Therefore, as will be described in greater detail hereinafter, by adjusting the gain and phase of the GPA 112 to minimize the distortion signal power, the power of the error amplifier 165 is minimized.

The output of the multiplexer 220 is provided via an analog-to-digital (A/D) converter 222 to a microprocessor 225. In response to the pilot signal power ($P_0$), the microprocessor 225 provides a pilot signal gain signal ($A_0$) and a pilot signal phase signal ($\phi_0$) to the GPA 155 for minimizing $P_0$. Additionally, the microprocessor 225 is responsive to the distortion signal power ($P_1$) for providing a distortion signal gain signal ($A_1$) and a distortion signal phase signal ($\phi_1$) to the GPA 112 for minimizing the magnitude of $P_1$. The gain signals and the phase signals are provided to the GPAs 112, 155 via a digital-to-analog (D/A) converter 230.

During operation of the mixers 194 and 195, DC offset voltages may build up in the mixers due to imperfections in the mixers and therefore cause errors in the measurement of $V_I$ and $V_Q$. By temporarily, periodically removing the pilot signal from the input of the main amplifier 125 while leaving the operation of the mixers 194 and 195 otherwise unchanged, the magnitude of the DC offset voltages at the output of the averaging circuits 212 and 213 are measured and removed by subtraction. The timing of the switching of the chop switch 190 is controlled by a control signal on the line 197 provided by the microprocessor 225. The microprocessor 225 may be provided with a separate clock for providing the control signal on the line 197, or a subroutine may be provided which, in response to the microprocessor's internal clock, periodically provides the control signals on the line 197 to switch the chop switch 190.

Figures 3, 4:
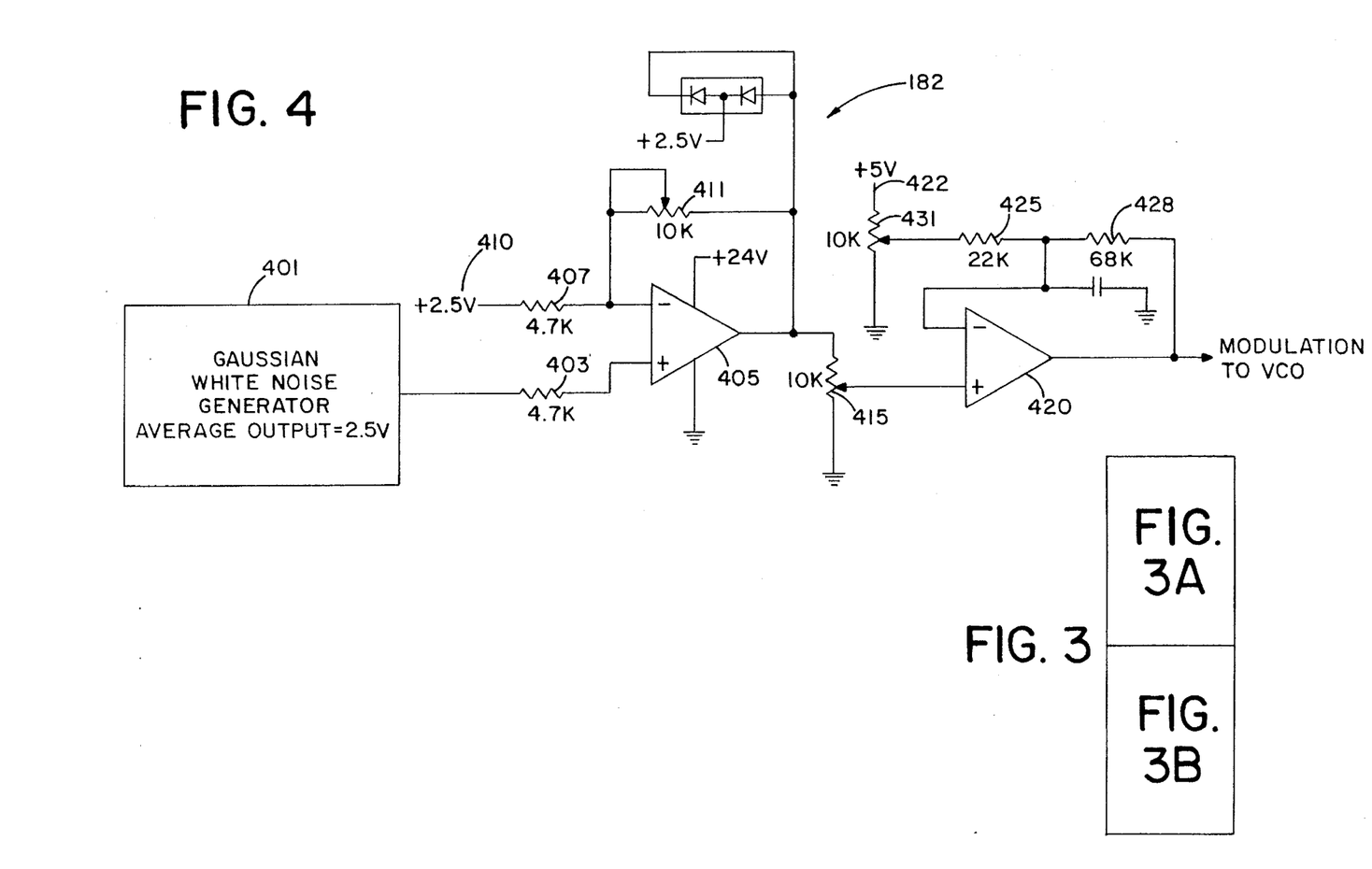
FIG. 3 is a diagram showing the relationship between FIGS. 3a and 3b.
FIG. 4 is a schematic block diagram of a circuit for providing a noise signal which modulates a pilot signal used in the system of FIG. 2.
Figure 3A:
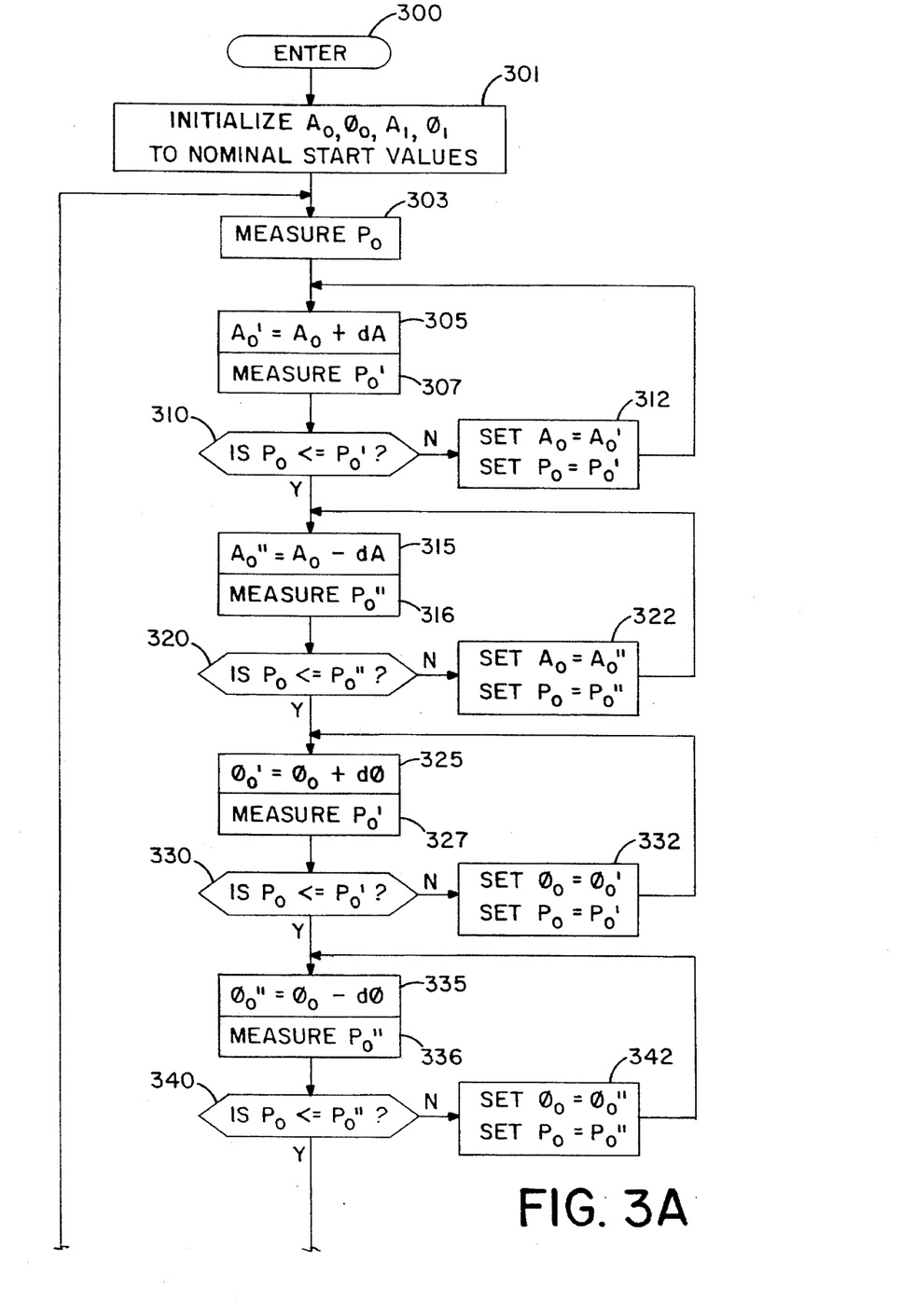
FIGS. 3a and 3b are a logic flow diagram implemented by a microprocessor of the system of FIG. 2 for controlling the gain and phase of a pair of electronically adjustable attenuator and phase shifters.
Figure 3B:
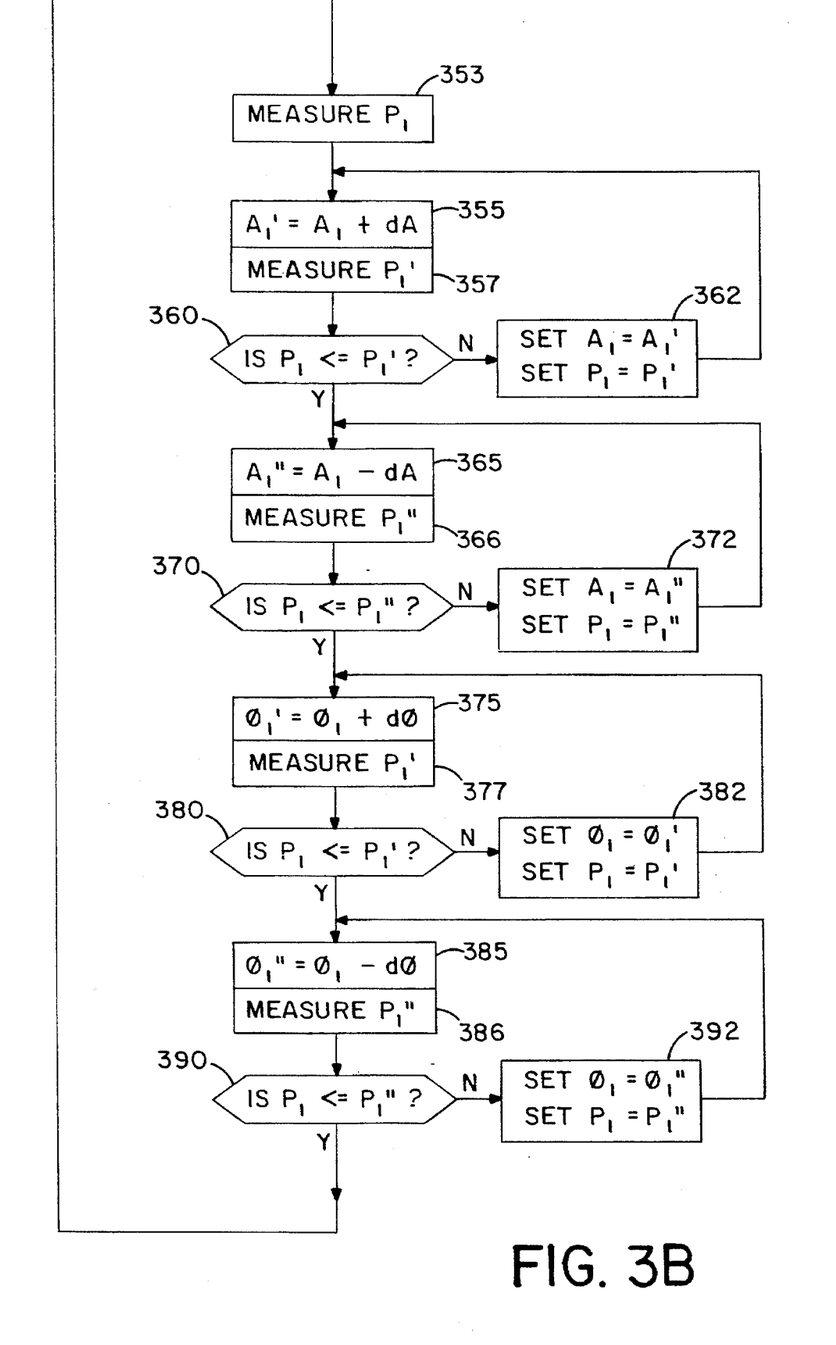

The microprocessor 225 uses the subroutine of FIGS. 3a and 3b for determining the proper gain and phase values to be provided to the GPAs 112, 155. Referring to FIGS. 3a and 3b, the subroutine is entered in a step 300 and then a step 301 is performed wherein the gain and phase values for the GPAs are initialized to nominal start values ($A_0$, $\phi_0$, $A_1$, $\phi_1$). Next, the microprocessor measures the initial pilot signal power ($P_0$) in a step 303 and then increments the corresponding pilot signal gain signal ($A_0$) by a gain increment (dA) in a step 305. The microprocessor then measures the new pilot signal power ($P_0'$) in a step 307. Next, a test 310 is performed to determine if the initial pilot signal power ($P_0$) is less than or equal to the new pilot signal power ($P_0'$). If the results of the test 310 are negative, a step 312 is performed wherein the pilot signal gain signal is set equal to the incremented pilot signal gain signal and the initial pilot signal power is set equal to the new pilot signal power corresponding to the incremented pilot signal gain signal. The subroutine then returns to the steps 305 and 307.

If the results of the test 310 are positive, steps 315 and 316 are consecutively performed wherein the pilot signal gain signal is decremented by the gain increment (dA) and a new pilot signal power is measured ($P_0''$). Next, a test 320 is performed to determine if the initial pilot signal power ($P_0$) is less than or equal to the new pilot signal power ($P_0''$). If the results of the test 320 are negative, a step 322 is performed wherein the pilot signal gain signal is set equal to the decremented pilot signal gain signal and the initial pilot signal power is set equal to the new pilot signal power corresponding to the decremented pilot signal gain signal. The subroutine then returns to the steps 315 and 316.

If the results of the test 320 are positive, no change is required in the pilot signal gain signal, and steps 325 and 327 are consecutively performed wherein the pilot signal phase signal ($\phi_0$) is incremented by a phase increment (d$\phi$), and the new pilot signal power ($P_0'$) is measured. Next, a test 330 is performed to determine if the initial pilot signal power ($P_0$) is less than or equal to the new pilot signal power ($P_0'$). If the results of the test 330 are negative, a step 332 is performed wherein the pilot signal phase signal is set equal to the incremented pilot signal phase signal and the initial pilot signal power is set equal to the new pilot signal power corresponding to the incremented pilot signal phase signal. The subroutine then returns to the steps 325 and 327.

If the results of the test 330 are positive, steps 335 and 336 are consecutively performed wherein the pilot signal phase signal is decremented by the phase increment and a new pilot signal power is measured ($P_0''$). Next, a test 340 is performed wherein the microprocessor checks if the initial pilot signal power ($P_0$) is less than or equal to the new pilot signal power ($P_0''$). If the results of the test 340 are negative, step 342 is performed wherein the pilot signal phase signal is set equal to the decremented pilot signal phase signal and the initial pilot signal power is set equal to the new pilot signal power corresponding to the decremented pilot signal phase signal. The subroutine then returns to the steps 335 and 336.

If the results of the test 340 are positive, no change is required in the pilot signal phase signal. Next, the microprocessor measures the initial distortion signal power ($P_1$) in a step 353 and then increments the corresponding distortion signal gain signal ($A_1$) by a gain increment (dA) in a step 355. The microprocessor then measures the new distortion signal power ($P_1'$) in a step 357. Next, a test 360 is performed to determine if the initial distortion signal power ($P_1$) is less than or equal to the new distortion signal power ($P_1'$). If the results of the test 360 are negative, a step 362 is performed wherein the distortion signal gain signal is set equal to the incremented distortion signal gain signal and the initial distortion signal power is set equal to the new distortion signal power corresponding to the incremented distortion signal gain signal. The subroutine then returns to the steps 355 and 357.

If the results of the test 360 are positive, steps 365 and 366 are consecutively performed wherein the distortion signal gain signal is decremented by the gain increment (dA) and a new distortion signal power is measured ($P_1''$). Next, a test 370 is performed to determine if the initial distortion signal power ($P_1$) is less than or equal to the new distortion signal power ($P_1''$). If the results of the test 370 are negative, a step 372 is performed wherein the distortion signal gain signal is set equal to the decremented distortion signal gain signal and the initial distortion signal power is set equal to the new distortion signal power corresponding to the decremented distortion signal gain signal. The subroutine then returns to the steps 365 and 366.

If the results of the test 370 are positive, no change is required in the distortion signal gain signal, and steps 375 and 377 are consecutively performed wherein the distortion signal phase signal ($\phi_1$) is incremented by a phase increment (d$\phi$), and the new distortion signal power ($P_1'$) is measured. Next, a test 380 is performed to determine if the initial distortion signal power ($P_1$) is less than or equal to the new distortion signal power($P_1'$). If the results of the test 380 are negative, a step 382 is performed wherein the distortion signal phase signal is set equal to the incremented distortion signal phase signal and the initial distortion signal power is set equal to the new distortion signal power corresponding to the incremented phase signal. The subroutine then returns to the steps 375 and 377.

If the results of the test 380 are positive, steps 385 and 386 are consecutively performed wherein the distortion signal phase signal is decremented by the phase increment and a new distortion signal power is measured ($P_1''$). Next, a test 390 is performed wherein the microprocessor checks if the initial distortion signal power ($P_1$) is less than or equal to the new distortion signal power ($P_1''$). If the results of the test 390 are negative, step 392 is performed wherein the distortion signal phase signal is set equal to the decremented distortion signal phase signal and the initial distortion signal power is set equal to the new distortion signal power corresponding to the decremented distortion signal phase signal. The subroutine then returns to the steps 385 and 386. If the results of the test 390 are positive, no change is required in the distortion signal phase signal, and the subroutine returns to the step 303 so that the gain and phase signals can again be checked and adjusted as necessary for minimizing both the pilot signal power and the distortion signal power.

The gain increment (dA) and the phase increment (d$\phi$) are selected to be small enough to provide for maximum removal of distortion from the feed forward amplifier output while being large enough so that it does not take excessive time to arrive at optimum gain and phase values.

FIG. 4 shows the noise source 182 which is used to modulate the VCO 180 (FIG. 2) for providing the pilot signal. Resistance and voltage values are provided in FIG. 4 for illustrative purposes only, and are in no way intended to limit the scope of the present invention. Referring now to FIG. 4, the output of a Gaussian white noise generator 401, having an average output of 2.5 volts, is provided via a resistor 403 to a non-inverting terminal of an operational amplifier (OP AMP) 405. The OP AMP 405 acts as a peak clipper wherein the amplitude excursions of the white noise generator 401 are limited to shape the output frequency spectrum of the VCO 180 (FIG. 2). A shaping control determines the amount of clipping that is used. The shaping control is implemented by a resistor 407 connected between a voltage 410 and the inverting terminal of the OP AMP 405 and a variable resistor 411 connected between the OP AMP inverting terminal and OP AMP output. The amount of clipping that is used may be varied by adjustment of the variable resistor 411.

The output of the OP AMP 405 is provided via a variable resistor 415 to the non-inverting terminal of a second OP AMP 420. The variable resistor 415 may be adjusted to set the width of the VCO output frequency spectrum. An offset voltage is applied to the inverting terminal of the second OP AMP 420 via a resistor 425 and is applied to the output terminal of the OP AMP via the resistor 425 and a second resistor 428. The center frequency of the noise source is adjusted by changing the off-set voltage using a variable resister 431 connected between a voltage 422 and ground 430.

Although the invention is described herein as using a random frequency pilot signal for improved feed forward amplifier distortion removal, it is expected that a pilot signal of a known, variable frequency could be used in accordance with the present invention. In this case, the VCO 180 (FIG. 2) could be modulated with a known, repeating variable frequency signal. It is important that such a known, repeating variable frequency signal be selected such that it is substantially different from the input signal and distortions introduced by the main amplifier so that the corresponding power level in the feed forward amplifier output can be accurately identified by the correlation detector of the error detection and correction system.

The pilot signal is described herein as being introduced at the input of the main amplifier for providing the distortion reduction of the present invention. However, the pilot signal may be combined with the input signal with in the main amplifier or at the output of the main amplifier in accordance with the present invention, as shown by the dashed line 120a in FIG. 2. For correct operation of the present invention, all that is required is that the pilot signal be combined with either the input signal or the amplified input signal prior to the sample of the amplified input signal is taken in the coupler 130.

Additionally, although the present invention is described with respect to a feed forward amplifier used for the amplification of RF signals, it is expected that the principles of the present invention are equally applicable to feed forward amplifiers used for the amplification of any electrical signals.

The gain and phase of the electronically adjustable gain and phase shifters 112, 155 are described herein as being provided in response to a subroutine executed by a microprocessor. However, the present invention may be implemented using analog circuitry, dedicated digital circuitry or as a software program using circuit designs well known in the art. Additionally, the invention may be implemented with a variety of delay times, various types of filtering and limiting, and other known design characteristics, to suit any implementation thereof.

Although the invention has been described and illustrated with respect to exemplary embodiments thereof, it should be understood by those skilled in the art that the foregoing and various other changes and omissions may be made therein and thereto without departing from the spirit and scope of the present invention.

What is claimed is:

1. A feed forward amplifier comprising:

a main amplifier coupled between an input at which an input signal is received and an output at which an output signal is provided, said output signal being an amplification of said input signal, and said main amplifier being responsive to said input signal for providing an amplified input signal;

sampling means responsive to said amplified input signal for providing a sample of said amplified input signal;

comparison means for comparing said sample of said amplified input signal with a sample of said input signal to produce a difference signal indicative of distortions introduced by said main amplifier;

an error amplifier responsive to said difference signal for providing a distortion signal which is an amplification of said difference signal;

combiner means for combining said distortion signal with said amplified input signal to provide said output signal, thereby compensating for said distortions;

means for combining a variable frequency, constant peak amplitude pilot signal in an input signal path between said input and said sampling means;

a correlation power detector having:
  (a) coupler means responsive to a sample of said output signal for providing a pair of sample signals having equal amplitude and ninety (90) degrees phase difference;
  (b) a pair of mixers, each mixer being responsive to a sample of said pilot signal and to one of said sample signals for providing a multiplication signal, each multiplication signal being the product of said sample of said pilot signal and one of said sample signals;
  (c) a pair of averaging circuit means each responsive to one of said multiplication signals for providing an averaged signal, each averaged signal being respectively indicative of the average of a corresponding multiplication signal;
  (d) means for providing a pilot signal power signal as the sum of the squares of said averaged signals, said pilot signal power signal being indicative of the magnitude of said pilot signal in said output signal; and means responsive to said pilot signal power signal for adjusting the gain and phase of said difference signal to minimize the magnitude of said pilot signal power signal.

2. A feed forward amplifier according to claim 1 further comprising:
  means responsive to a sample of said difference signal for providing a distortion signal power signal indicative of the magnitude of said difference signal; and
  means responsive to said distortion signal power signal for adjusting the gain and phase of said input signal to minimize the magnitude of said distortion signal power signal.

3. A feed forward amplifier according to claim 2 wherein said means responsive to said pilot signal power signal and said means responsive to said distortion signal power signal are signal processing means, said signal processing means providing gain and phase signals to electronically adjustable attenuator and phase shifters for adjusting the gain and phase of said difference signal and said input signal, respectively.

4. A feed forward amplifier according to claim 1 wherein said pilot signal is combined in said input signal path and then removed from said input signal path to provide for the detection and removal of bias voltages in said correlation power detector.

5. A feed forward amplifier according to claim 1 wherein said mixers are multiplication functions.

6. A feed forward amplifier according to claim 1 wherein said averaging circuit means are low pass filters.

7. A feed forward amplifier according to claim 1 wherein said pilot signal has a random frequency.

8. A feed forward amplifier according to claim 1 wherein said pilot signal is a sine wave of random frequency.

9. A feed forward amplifier according to claim 8 wherein the frequency of said sine wave is determined in response to a random noise generator.

10. A method for removing distortions from an output of a feed forward amplifier comprising the steps of:
  coupling a main amplifier between an input at which an input signal is received and the output at which an output signal is provided, said output signal being an amplification of said input signal, said main amplifier providing, in response to said input signal, an amplified input signal;
  sampling said amplified input signal at a sampling location at an output of said main amplifier, and providing an amplified input signal indicative thereof;
  comparing said sample of said amplified input signal with a sample of said input signal to produce a difference signal indicative of distortions introduced by said main amplifier;
  amplifying said difference signal and providing a distortion signal indicative thereof;
  combining said distortion signal with said amplified input signal to provide said output signal, thereby compensating for said distortions;
  prior to said step of sampling said amplified input signal, combining a variable frequency, constant amplitude pilot signal in an input signal path between said input and said sampling location;
  providing a correlation power detector responsive to a sample of said output signal and to a sample of said pilot signal for providing a pilot signal power signal, said correlation power detector performing the steps of:
    (a) providing, in response to a sample of said output signal, a pair of sample signals having equal amplitude and ninety (90) degrees phase difference;
    (b) providing a pair of multiplication signals, each multiplication signal being provided as the product of a sample of said pilot .signal and one of said sample signals, respectively;
    (c) providing a pair of averaged signals, each respectively indicative of the average of a corresponding multiplication signal;
    (d) providing said pilot signal power signal as the sum of the squares of said averaged signals; and
  adjusting the gain and phase of said difference signal to minimize the magnitude of said pilot signal power signal.

11. A method according to claim 10 further comprising the steps of:
  providing a distortion signal power signal indicative of the magnitude of said difference signal; and
  adjusting the gain and phase of said input signal to minimize the magnitude of said distortion signal power signal.

12. A method according to claim 10 further comprising the steps of:
  combining said pilot signal in said input signal path and then removing said pilot signal from said input signal path; and detecting and removing bias voltages in said correlation power detector.

13. A method according to claim 10 further comprising the step of providing said pilot signal as a random frequency signal.

14. A method according to claim 10 further comprising the step of providing said pilot signal as a sine wave signal having a random frequency.

* * * * *